United States Patent
De Haas

(10) Patent No.: US 7,482,860 B2
(45) Date of Patent: Jan. 27, 2009

(54) MOS SWITCHING CIRCUIT

(75) Inventor: Clemens Gerhardus Johannes De Haas, Nijmegen (NL)

(73) Assignee: NXP B.V., Eindhoven (NL)

( * ) Notice: Subject to any disclaimer, the term of this patent is extended or adjusted under 35 U.S.C. 154(b) by 224 days.

(21) Appl. No.: 10/586,507

(22) PCT Filed: Dec. 30, 2004

(86) PCT No.: PCT/IB2004/052940

§ 371 (c)(1),
(2), (4) Date: Jul. 17, 2006

(87) PCT Pub. No.: WO2005/078931

PCT Pub. Date: Aug. 25, 2005

(65) Prior Publication Data
US 2007/0159229 A1    Jul. 12, 2007

(30) Foreign Application Priority Data
Jan. 19, 2004    (EP)    ................................ 04100147

(51) Int. Cl.
*H03K 17/72* (2006.01)
(52) U.S. Cl. ........................................ 327/544; 326/34
(58) Field of Classification Search ............ 326/31, 326/33, 34; 327/434, 436, 437, 544
See application file for complete search history.

(56) References Cited

U.S. PATENT DOCUMENTS

| | | | | | |
|---|---|---|---|---|---|
| 4,710,730 | A | * | 12/1987 | Doyle, III | ............... 331/116 FE |
| 5,376,837 | A | * | 12/1994 | Nakano | ....................... 327/530 |
| 6,018,252 | A | * | 1/2000 | Imaizumi | ...................... 326/81 |
| 6,477,079 | B2 | * | 11/2002 | Kaneko et al. | .............. 365/149 |
| 6,487,133 | B2 | * | 11/2002 | Wada et al. | .................. 365/205 |
| 6,559,721 | B2 | * | 5/2003 | Ausserlechner et al. | ..... 330/264 |
| 6,661,253 | B1 | * | 12/2003 | Lee et al. | ........................ 326/41 |
| 7,019,418 | B2 | * | 3/2006 | Kakiuchi | ..................... 307/126 |
| 2003/0151945 | A1 | * | 8/2003 | Tanzawa | ................ 365/185.01 |
| 2004/0095182 | A1 | * | 5/2004 | Tomari et al. | ............... 327/417 |
| 2005/0200400 | A1 | * | 9/2005 | Takeuchi | ..................... 327/536 |
| 2006/0049860 | A1 | * | 3/2006 | Bando | .......................... 327/143 |
| 2007/0063763 | A1 | * | 3/2007 | Yoo et al. | .................... 327/544 |
| 2007/0159239 | A1 | * | 7/2007 | Rhee | ........................... 327/544 |
| 2007/0268774 | A1 | * | 11/2007 | Lee et al. | ............... 365/230.06 |

\* cited by examiner

*Primary Examiner*—Lincoln Donovan
*Assistant Examiner*—Thomas J Hiltunen

(57) ABSTRACT

An electronic circuit has a signal conductor (11), a power supply reference conductor (10) connected by a switching circuit. The switching circuit contains a PMOS transistor (17) and an NMOS transistor realized on a common substrate (100). The NMOS transistor (17) has a source coupled to the power supply reference conductor (10). The NMOS transistor (18) has a source coupled to the drain of the PMOS transistor (17), and a drain coupled to the signal conductor (11). A control circuit (13, 14, 15, 16) switches between an "on" state and an "off" state, in which the control circuit (13, 14, 15, 16) controls the gate source voltages of the first and second MOS transistor (17, 18) to make channels of these MOS transistors (17, 18) conductive and not to make the channels of these first and second transistors (17, 18) conductive respectively. Preferably a complementary switching circuit is also provided. The complementary switching circuit uses opposite polarity voltage differences, an NMOS transistor (27) coupled to a second power supply and a PMOS transistor (28) coupled to a signal conductor. The on resistances of the switching circuits are matched by matching the NMOS gate-source voltages, as well as the PMOS gate source voltages.

6 Claims, 3 Drawing Sheets

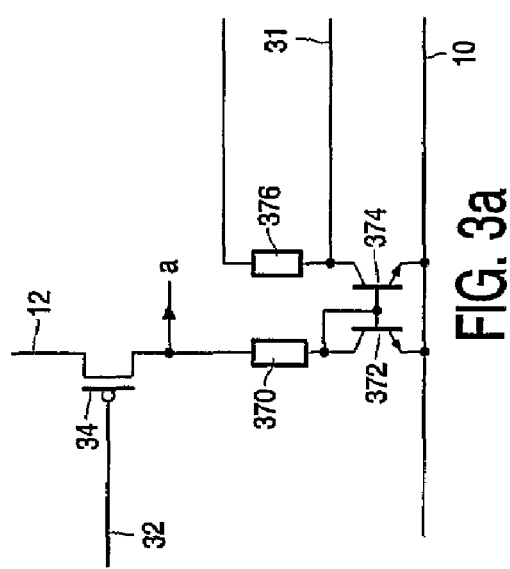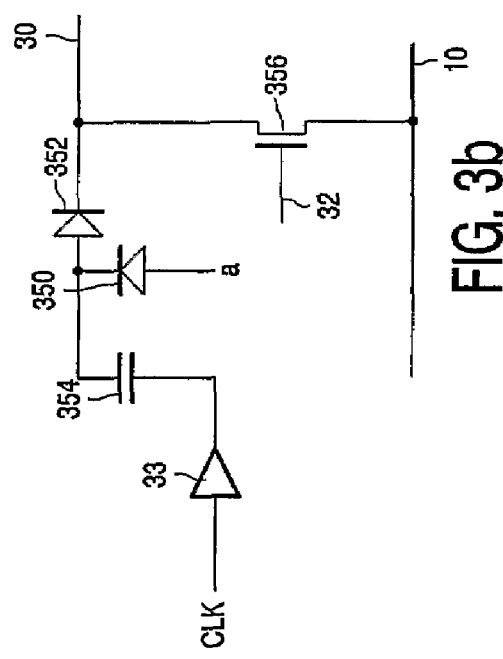

MOS SWITCHING CIRCUIT

Figure 1:
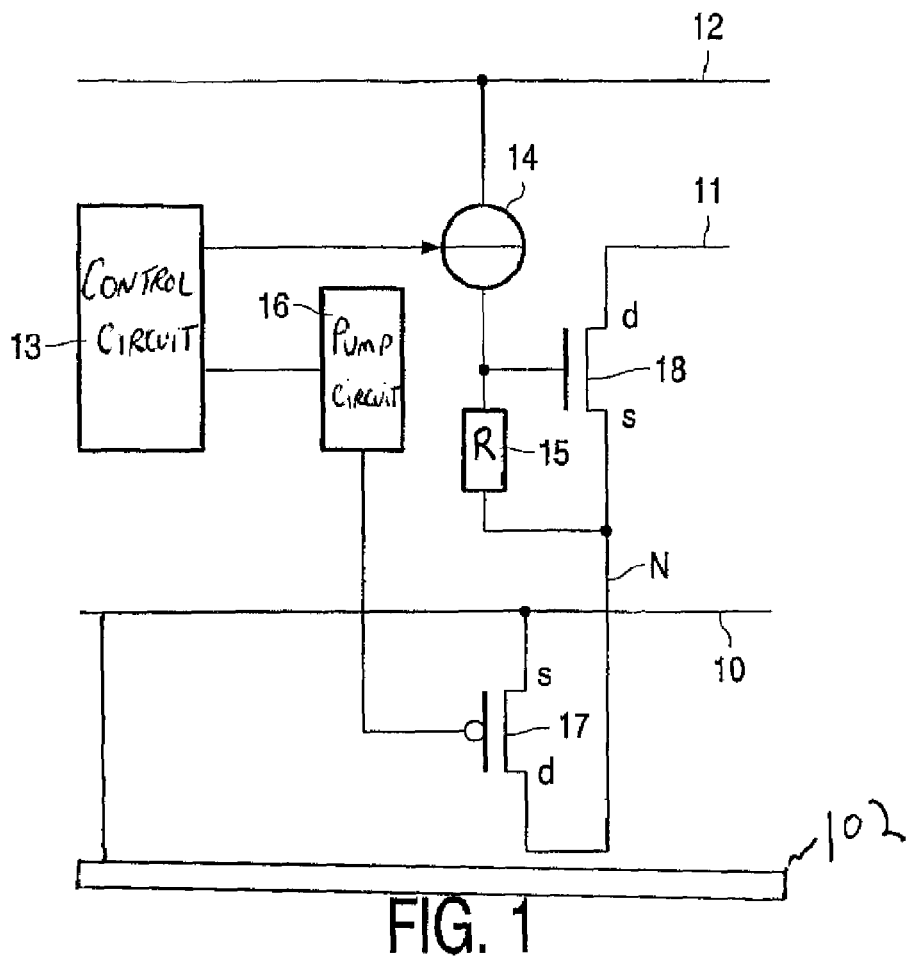

The invention relates to an electronic circuit with a switching circuit, more particularly a switching circuit coupled to a bus communication line used in a hostile interference environment and more particularly a pair of switching circuits with matched "on" resistance.

An electronic switching circuit has two terminals that are either electrically connected or substantially isolated from one another, dependent on a control signal. A simple electronic switching circuit consists of a single transistor, e.g. an NMOS transistor, with a main current channel coupled between the two terminals. Such a simple switching circuit does not work satisfactorily in hostile electromagnetic environments, wherein the voltage between the terminals exhibits large fluctuations and even sign changes. An NMOS transistor, for example, has a drain-backgate diode that conducts a current, which bypasses the main current channel when the voltage across the main current channel biases the diode in forward direction. Similarly, voltage fluctuations at the source of the transistor relative to the control voltage at its gate can switch the transistor between a conductive and non-conductive state.

One way to realize a switching circuit that works in hostile environments is to use two NMOS transistors, with their main current channels in series between the terminals of the switching circuit, but with their source-drain paths in mutually opposite direction between the terminals. Thus, the drain back-gate diodes of the two transistors are in anti-series, that is, arranged in mutually opposite direction, so that at least one of the transistors works without conducting forward bypass current through its drain-backgate diode, independent of the sign of the voltage difference between the terminals.

This solution requires a floating supply circuits for the gates-source voltage of at least one of the transistors, because its source voltage must be allowed to float under influence of voltage fluctuations at at least one of the terminals. One example of a useful floating gate-source voltage source is a current source connected to the gate of such a transistor, and a resistor coupled between the gate and the source, so that the current from the source creates a voltage drop over the resistor that determines the gate-source voltage.

However, in such a switching circuit one of the transistors must be over-dimensioned compared to the other in order to prevent breakdown during use. In NMOS transistors, for example the breakdown voltage of the drain-backgate diode is much larger when the back gate voltage is above the substrate voltage than when the back gate voltage is below the substrate voltage. Therefore the transistor whose drain-back-gate diode is reversely biased at terminal voltages below the substrate voltage must be over-dimensioned.

Another problem occurs when a pair of switching circuits is used to connect to different power supply conductors and equal "on" impedances to the power supply connections are needed. An example of this occurs when a communication bus contains two conductors, a first one of which must be connected to a first power supply conductor, and a second one of which must be connected to a second power supply conductor, each with the same "on" impedance. In this case typically one switching circuit contains two NMOS transistors and the other switching circuit contains two PMOS transistors. This makes it difficult to match the "on" impedances.

Among others, it is an object of the invention to provide an electronic circuit with a switching circuit that is able to withstand voltages in either direction across its terminals and in which no over-dimensioned transistors need be used.

It is a further object of the invention to provide for an electronic circuit with a bus conductor, in which a potential of the bus conductor is pulled to a power supply potential through a switching circuit that is able to withstand voltages in either direction across its terminals and in which no over-dimensioned transistors need be used.

It is another object of the invention to provide for an electronic circuit wherein substantially equal "on" impedances to one or more bus conductors are provided through switching circuits.

The invention provides for an electronic circuit according to claim 1. According to the invention the channels of a first and second MOS transistor of mutually opposite conductive type are connected in series between a signal conductor and a power supply conductor. The source of the first transistor is coupled to the power supply conductor and its drain is coupled to the source of the second transistor, whose drain is coupled to the output.

It should be noted that the connection deviates from the conventional drain-drain or source-source coupling of complementary transistors. As a result, the source drain diodes of the transistors are in anti series. None of the transistors needs to be over-dimensioned relative to the other even if a common substrate voltage is used for both transistors, or substrate voltages that are not so different so that the difference exceeds all possible voltage fluctuations. This is because the first and second transistor have maximum breakdown voltages at drain voltages in mutually opposite directions relative to substrate voltage, and their drain back-gate diodes are forward biased when the drain voltages have the sign that corresponds to the lower breakdown voltage.

When two complementary switching circuits of this mixed conductivity type are used, one for connection to the first power supply conductor and one for connection to the other power supply connection, substantially equal "on" impedances under low signal conditions can easily be realized by the matching on-resistances of the NMOS transistors in the switching circuits and matching on-resistance of the PMOS transistors in the switching circuits. This makes such switching circuits an advantageous choice for use in bus systems where such equal "on" impedances are needed. The substrate of the transistors in each switching circuit are preferably coupled to the respective power supply conductors to which the switches connect. However, if the supply voltage difference between these power supply conductors is not large (less than the breakdown voltages), the substrates of both switching circuits may also be at the same potential.

The source gate voltage of the second MOS transistor is preferably controlled with a floating voltage source, which does not fix the source or gate voltage relative to the power supply connection, but merely defines the gate-source voltage difference. Preferably, this floating voltage source is realized with a current source circuit coupled to the gate of the second transistor and a resistive element coupled between the gate and the source of the second transistor.

When the circuit has a single power supply, which applies a power supply voltage between the power supply reference conductor and a power supply input, the current source of the floating voltage source is preferably supplied with current from the power supply input, whereas the gate of the first transistor is drive by a pump circuit with a voltage outside the power supply range between the input and the power supply reference conductor. Thus, the only part of the control circuit that draws significant current, i.e. the current source circuit in the floating voltage source, can be supplied directly from the power supply. The pump circuit has to drive only a gate, which requires little current, so that the pump circuit can remain small.

Figure 2:
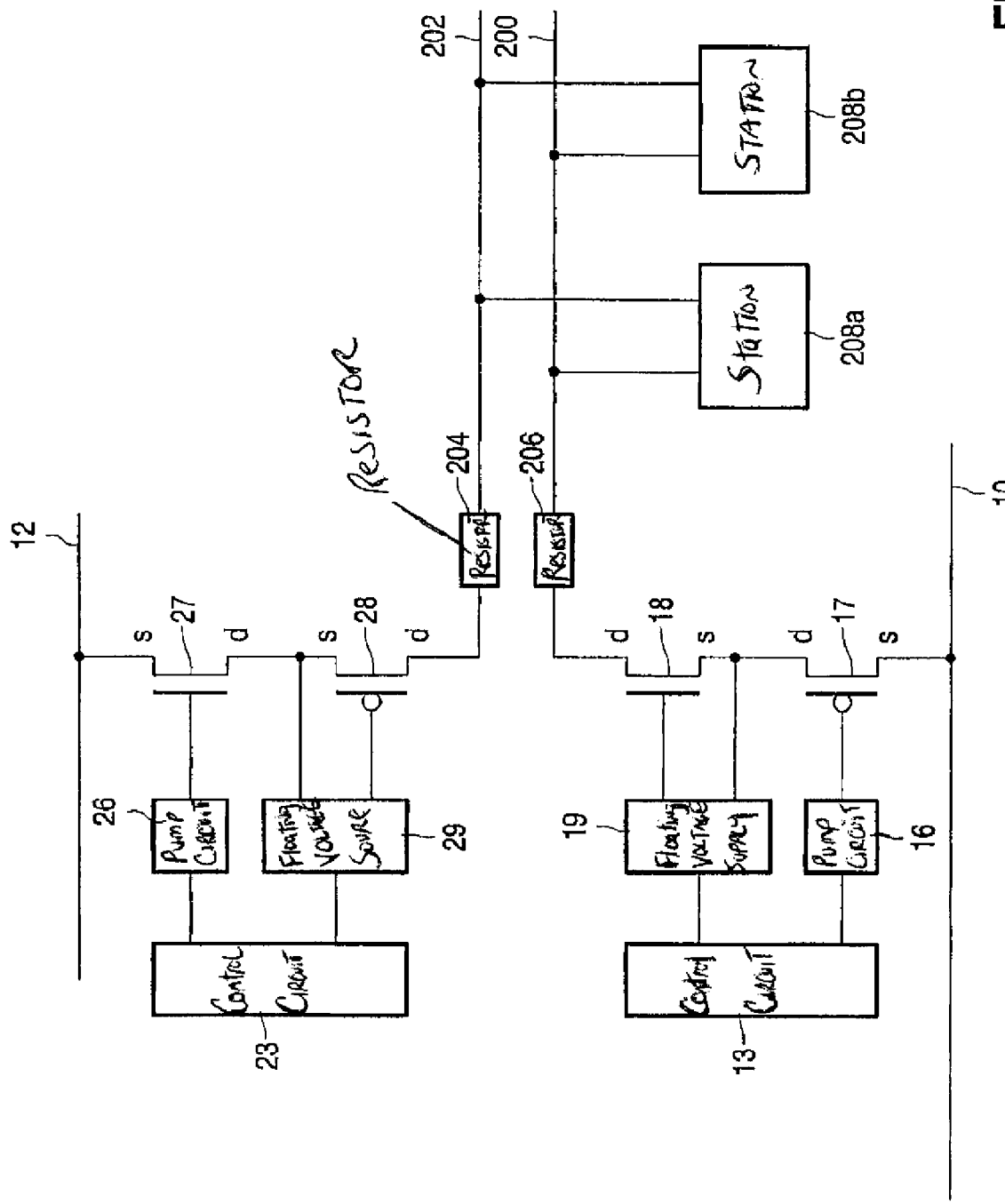

These and other objects and advantageous aspects of the invention will be described by means of non-limitative examples using the following figures:

FIG. 1 shows an electronic circuit with a switching circuit;
FIG. 2 shows a bus system with a pair of switching circuits;
FIG. 3a shows part of a switching circuit;
FIG. 3b shows a further part of a switching circuit.

FIG. 1 shows an electronic circuit with a switching circuit. The electronic circuit contains a first power supply conductor 10, a second power supply conductor 12, a signal conductor 11, a control circuit 13, a current source 14, a resistor 15, a pump circuit 16, a PMOS transistor 17 and an NMOS transistor 18. (it will be understood that, as is conventional, the term "MOS transistor" includes transistors with any kind of conductive gate material, such as polysilicon).

First and second power supply conductors 10, 12 are the negative and positive poles of the power supply of the electronic circuit respectively. Signal conductor 11 is connected to the drain of NMOS transistor 18. The source of NMOS transistor 18 is connected to an internal node N. Internal node N is coupled to the drain of PMOS transistor 17 and the source of PMOS transistor is coupled to first power supply conductor 10. Together, current source 14 and resistor 15 form a floating gate-source voltage supply. Resistor 15 is coupled between the gate and source of NMOS transistor 18 and current source 14 is coupled between second power supply connection 12 and the gate of NMOS transistor 18. Pump circuit 16 has an output coupled to the gate of PMOS transistor 17. Control circuit 13 has outputs coupled to control inputs of pump circuit 16 and current source 14.

It should be noted that the source and drain of PMOS transistor 17 are connected so that the inherent drain back-gate diode of PMOS transistor 17 has its forward direction coupled from node N towards first power supply conductor 10. The source and drain of NMOS transistor 18 are connected so that the inherent drain back-gate diode of NMOS transistor 18 has its forward direction coupled from node N towards signal conductor 11. That is, these diodes are coupled in series between signal conductor 11 and first power supply conductor 10 with their forward direction in mutually opposite direction.

The nature of the drain back gate diode is of course well-known, but will be briefly recalled.

Figure 1A:
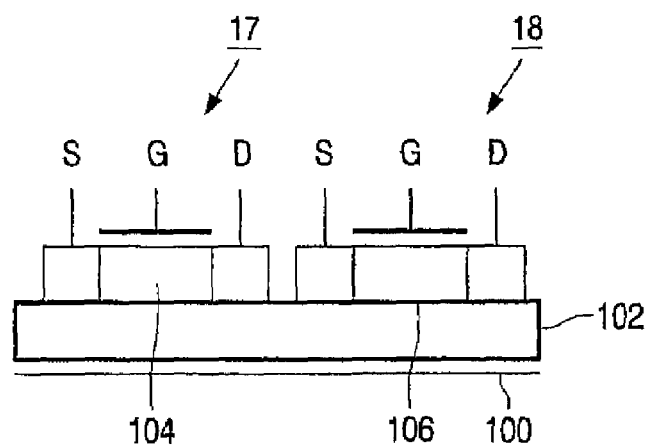

FIG. 1a shows transistors 17, 18 realized on an insulating substrate 102 with a back electrode 100. Each MOS transistors contains source and drain (S, D) regions of a first conductivity type, (N type in case of NMOS transistor 18 and P type in case of PMOS transistor 17) separated by an intervening region 104, 106 of second conductivity type, opposite the first conductivity type. The major part of the intervening region 104, 106 forms the back gate of the transistor. A gate electrode (G) is provided next to the surface of the intervening region, to form the channel of the transistor at the surface of the intervening region (104, 106). Because the back gate on one hand and the source and drain regions on the other hand are of mutually opposite conductivity type junction diodes are formed from the source and drain to the back gate. Conventionally, and in the present circuit, only the drain back gate diode is relevant for the operation of the transistor. The source-back gate diode is short circuited by connecting a conductor between the source and back gate, or more generally by applying a source back gate voltage so that the source back gate diode is not forward biased.

In operation, the circuit of FIG. 1 serves to provide an electric coupling between signal conductor 11 and first power supply conductor 10. Under control of control circuit 13 the electric coupling is switched between an "on" and an "off" state, in which the electric coupling has a high and low impedance respectively.

In the "on" state current source 14 supplies a current to resistor 15 so that a voltage drop arises over resistor that is applies between the gate and source of NMOS transistor 18, with a sign and size to make the channel of this NMOS transistor 18 conductive. (Although a resistor 15 is shown, it will be understood that any kind of element with a resistance value may be used, for example the channel of a suitably biased transistor, a track of suitable length and width made of a material (e.g. a metal or poly-silicon) with a finite resistance value etc.). Also in the "on" state pump circuit 16 supplies a voltage below that of first power supply conductor 10 to the gate of PMOS transistor 17, with a size to makes the channel of this PMOS transistor 17 conductive.

In the "off" state, current source 14 supplies no current, to make NMOS transistor 18 non-conductive and pump circuit 16 supplies a voltage equal to that of first power supply conductor 10 or above it to the gate of PMOS transistor 17 to make the channel of PMOS transistor 17 non-conductive.

Normally in the "on" state there is at most a small voltage difference between signal conductor 11 and first power supply conductor 10. Consequently, both PMOS transistor 17 and PMOS transistor 18 operate in their small voltage range (non-saturated, resistance behavior). The impedance between signal conductor 11 and first power supply conductor 10 is the sum of the channel impedances of the PMOS transistor 17 and PMOS transistor 18, which depend on the gate-source voltages applied to these transistors.

When the voltage difference between signal conductor 11 and first power supply conductor 10 increases, eventually one of transistors 17, 18 behaves as a current source (NMOS transistor 18 when the voltage on signal conductor 11 is above that of the voltage on first power supply conductor and PMOS transistor 18 when the voltage on signal conductor 11 below). The drain back gate diode of the other transistor 17, 18 is forward biased in this case, so that the other transistor behaves as a forward biased diode in this case.

In the "off" state a high impedance is realized between signal conductor 11 and first power supply conductor 10. Normally in the "off" state the voltage on signal conductor 11 is higher than that on first power supply conductor 10. In this case the drain-backgate diode of NMOS transistor 18 is reverse biased and the channel of NMOS transistor 18 presents a high resistance, its gate-source voltage being below its threshold value. Thus, NMOS transistor 18 ensures a high impedance, PMOS transistor 17 cannot be relied upon in this case because its drain-backgate diode is forward biased in this case.

Due to fluctuations the voltage on signal conductor 11 may also become lower than that on first power supply conductor 10. In this case the drain-backgate diode of PMOS transistor 17 is reverse biased and the channel PMOS transistor 17 presents a high resistance, its gate-source voltage being below its threshold value. Thus, PMOS transistor 17 ensures a high impedance, NMOS transistor 18 cannot be relied upon in this case because its drain-backgate is diode forward biased in this case.

Preferably NMOS transistor 18 and PMOS transistor 17 are realized without a common semi-conductive substrate, preferably as SOI (Silicon On Insulator) transistors with on a common isolating substrate. A back electrode 100 is preferably attached to such an isolating substrate. In this case, the breakdown voltage of the drain backgate diodes in reverse bias may depend on the voltage difference between the drain and the back electrode. Generally in NMOS transistors the breakdown voltage is higher or lower when the drain voltage is above or below that of the back electrode respectively; this is the case for DMOS transistors for example, which have extended drain back-gate junctions to handle high voltages. Reversely, in PMOS transistors the breakdown voltage is generally lower or higher when the drain voltage is above or below that of the back electrode respectively. It should be noted that in the circuit of FIG. 1, when the channel NMOS transistor 18 takes a high voltage, its drain always has a voltage above that of first power supply connection 10, and that when the channel PMOS transistor 17 takes a high voltage its drain always has a voltage below that of first power supply connection 10. Thus, with the back electrode at a voltage around that of first power supply conductor 10, the circuit optimally profit from the higher breakdown voltages. Although a single back electrode 100 is shown it will be understood that the back electrode 100 may be made up of separate parts, which may possibly have different voltages near the voltage of the power supply conductor 10 (e.g. at the voltage of the second power supply conductor 12). In case of power supply fluctuations the drain voltages may reach far below or above these voltages at the back electrode, causing the similar problems.

FIG. 2 shows an electronic circuit in which two complementary switching circuits are used. The electronic circuit contains a communication bus, with a first and second bus conductor 200, 202, to which a number of stations 208a,b are attached (two shown, but any number may be used). Typically, bus conductors 200, 202 are wires that are not (entirely) part of an integrated circuit, but extend through an apparatus, such as a car, in which the stations 208a,b are located at different locations.

Bus conductors 200, 202 are coupled to first and second power supply conductor 10, 12 respectively. First bus conductor 200 is coupled to first power supply conductor 10 via a series connection of a first resistor 206 and a first switching circuit. Second bus conductor 202 is coupled to second power supply conductor 12 via a series connection of a second resistor 204 and a second switching circuit.

In operation stations 208a,b communicate with one another by pulling the potential of first and second bus conductor 200, 202 towards that of the second and first power supply conductor 10, 12, so that current is drawn from the other power supply conductor 10, 12 via resistors 204, 206. The electronic switches are used to disconnect the bus conductors 200, 202 from the power supply conductors 10, 12 in a sleep state, for example to reduce battery power consumption in that sleep state, especially if there should be a short circuit from one of the bus conductors to a power supply conductor.

The first switch that couples first bus conductor 200 to first power supply conductor 10 is realized with NMOS transistor 18 and PMOS transistor 17 as shown in FIG. 1, which will now be referred to as first NMOS transistor 18 and first PMOS transistor 17. Instead of current source 14 and resistor 15 a floating voltage supply 19 is shown.

The structure and operation of the second switch that couples second bus conductor 202 to second power supply conductor 12 is complementary to that of the first switch. The second switch contains a second NMOS transistor 27 and a second PMOS transistor 28. Second NMOS transistor 27 has a source coupled to second power supply conductor 12 and a drain coupled to the source of second PMOS transistor 28. The drain of second PMOS transistor is coupled to second bus conductor 202 via resistor 204. A farther control circuit 23, further pump circuit 26 and further floating voltage source 29 are provided. Further control circuit 23 has control outputs coupled to further pump circuit 26 and further floating voltage source 29. Further pump circuit 26 has an output coupled to the gate of second NMOS transistor 27. Further floating voltage source 29 has outputs coupled to the source and gate of second PMOS transistor 28.

In the bus circuit, to ensure symmetric signals on bus conductors 200, 202 it is desirable that the impedances that coupled the first and second bus conductor 200, 202 to the first and second power supply conductors 10, 12 are substantially equal, at least in the "on" state, when the voltage difference across the switches is small. Use of symmetric signals is advantageous because it reduces interference caused by signals on bus conductors 200, 202. The substantially equal impedances need for the symmetric signals are easily realized because only NMOS transistors need to be matched with NMOS transistors and PMOS transistors with PMOS transistors: no PMOS-NMOS impedance matching is needed.

The impedance coupled between first bus conductor 200 and first power supply conductor 10 is that of a series arrangement of resistor 206, the channel of first NMOS transistor 18 and first PMOS transistor. In the "on" state resistor takes most of the voltage drop across the series arrangement and both first NMOS transistor 18 and first PMOS transistor are in their linear range (non saturated behavior as resistor). Similarly, the impedance coupled between second bus conductor 202 and second power supply conductor 12 is that of a series arrangement of resistor 204 and the resistance of the channel of second NMOS transistor 27 and second PMOS transistor 28.

By matching first and second NMOS transistor 18, 27 geometrically and in terms of applied gate-source voltage the impedance contributions of these NMOS transistors are made substantially equal (it may be noted that the gate source voltage of first NMOS transistor 18 is controlled by floating voltage supply circuit 19, and the gate source voltage of second NMOS transistor is controlled by further pump circuit 26). Similarly, by matching first and second PMOS transistor 17, 28 geometrically and in terms of applied gate-source voltage, the impedance contributions of these PMOS transistors are made substantially equal.

FIG. 3a shows an example of a floating voltage source for second PMOS transistor 28. The circuit contains a control transistor 34, a first and second resistor 370, 376 and a current mirror realized with bipolar transistors 372, 374. The control electrode of control transistor 34 is coupled to a control input 32 of the floating voltage source. Second power supply conductor 12 is coupled to the input of the current mirror successively via the channel of control transistor 34 and first resistor 370. The output of the current mirror forms a first terminal 31 of the floating voltage source (coupled to the gate of second PMOS transistor 28, not shown). Via second resistor 376 the output of the current mirror is coupled to the second terminal of the floating voltage source (coupled to the source of second PMOS transistor 28, not shown).

In operation a control signal at input 32 makes control transistor 34 conductive when the "on" state must be realized, and non-conductive when the "off" state must be realized. In the on state a current flows from second power supply conductor 12 to the input of the current mirror via first resistor 370. The current equals $(Vs-Va-Vf)/R$, where Vs is the voltage difference between the first and second power supply connection 10, 12, Va is the voltage drop between the second power supply connection and the node "a" between control transistor 34 and first resistor 370 and Vf is the forward diode bias voltage that determines the input voltage of the current mirror. The current mirror reflects the current and its output current flows through second resistor 376. The input output ratio of the current mirror and the resistance values are selected so that the voltage drop across both resistors 370, 376 is equal (both being substantially Vs−Va−Vf, or of the order of Vs). Typically the input output ratio is one and the resistance values are equal.

FIG. 3b shows an example of a pump circuit. The pump circuit contains a driver 33, a first and second diode 350, 352, a pump capacitor 354 and a discharge transistor 356. A clock input CLK is coupled to the input of driver 33, which has an output coupled to a first electrode of pump capacitor 354. First diode is coupled in its reverse direction from the second electrode of pump capacitor 354 to node "a" (see FIG. 3a). Second diode 352 is coupled in its forward direction from the second electrode of pump capacitor 354 to an output 30 of the pump circuit. Discharge transistor 356 has its main current channel coupled between output 30 and first power supply conductor 10. Its control electrode is coupled to input 32.

In operation a clock signal is supplied to the input of driver 33. Any suitable clock frequency may be used. Driver 33 preferably has limited output slew rate. This minimizes coupling of the frequency to the bus conductors. Driver drives the first electrode of pump capacitor 354 with a voltage swing that substantially equals the voltage difference Vs thus raising the peak voltage at the second electrode to this voltage difference Vs above the voltage at node "a", minus the forward bias voltage Vf1 of first diode 350. The voltage at output 30 also involves a voltage drop Vf2 across second diode 352 and is thus 2Vs−Va−Vf1−Vf2. As a result the gate source voltage of second NMOS transistor 27 is Vs−Va−Vf1−Vf2, which is of the order of Vs. When the circuit switches to the off state, discharge transistor 356 discharges output 30 and control transistor 34 becomes non-conductive so that the maximum voltage at the second electrode of pump capacitor 350 drops.

In practice, because the currents through diodes are very small Vf1 Vf2 are small, and Vf1+Vf2 are approximately equal as a result the deviations between Vs and the gate source voltages of both second NMOS transistor 27 and second PMOS transistor 28 are substantially equal.

Similar circuits may be used for generating the gate source voltages of first NMOS transistor 18 and first PMOS transistor 18, so the gate source voltages of these first transistors are equal to those of the first transistors. However, it will be noted that for providing matched on resistances it suffices that the gate-source voltages of the first and second NMOS transistor 18, 27 are substantially equal and that the gate-source voltages of the first and second PMOS transistor 17, 28 are substantially equal: the gate-source voltages of PMOS and NMOS transistors need not be equal. Therefore, the gate-source voltage caused by further charge pump 26 preferably substantially equals the gate source voltage caused by floating voltage source 19. Therefore, the gate-source voltage caused by charge pump 16 preferably substantially equals the gate source voltage caused by further floating voltage source 29.

Although the invention has been illustrated by specific embodiments, it will be understood that the invention is not limited to these embodiments. For example, it will be understood that without deviating from the invention additional components may be included in series with the NMOS and PMOS transistors in the switching circuits, e.g. between the NMOS and PMOS transistor. Similarly, although pump circuits are shown to derive the gate voltages from the power supplied between the first and second power supply conductor, it will be appreciated that other circuits may be used to provide the gate voltages outside the range between the first and second power supply conductor, such as for example additional power supply lines for supply voltages outside this range. Although separate control circuits 13, 23 are shown, it will be understood that in practice a combined control circuit may be used which correlates switching by the switching circuits.

Similarly it will be realized that one important application of the invention is in bus communication systems with first and second bus conductors that have to be pulled to first and second power supply potentials with equal impedances. But it will be clear that the invention is not limited to this application, for example the invention may also be applied to switching circuits that alternately pull the same signal conductor (in particular a bus conductor that is susceptible to unpredictable voltage fluctuations) to different power supply voltages.

Furthermore, although the invention is preferably applied to switching circuits for pulling potentials without directly communicating information (e.g. to pull during normal use but not in a sleep state, in which case control circuits 13, 23 decide about the sleep state), it will be understood that the switching circuits may also be used to apply information. In this case, the control circuits (or combined control circuit) are (or is) coupled to the logic circuits that provide the signals that have to be applied. If a pumping circuit is used, it preferably ensured that the frequency of this circuit does not interfere with the logic signals (e.g. is much higher).

The invention claimed is:

1. An electronic circuit, comprising a signal conductor a power supply reference conductor and a switching circuit coupled between the signal conductor and the power supply reference conductor, the switching circuit comprising: a substrate arrangement coupled to the power supply reference conductor; a first MOS transistor realized on said substrate arrangement with a source, a drain and a gate, the source being coupled to the power supply reference conductor the first MOS transistor having a first conductivity type; a second MOS transistor realized on said substrate arrangement with a source, a drain and a gate, the source being coupled to the drain of the first MOS transistor the drain being coupled to the signal conductor the second MOS transistor having a second conductivity type opposite the first conductivity type; a control circuit with outputs coupled to the gate of the first MOS transistor and the gate and source of the second MOS transistor the control circuit being arranged to switch between an "on" state and an "off" state, in which the control circuit controls the gate source voltages of the first and second MOS transistors to make channels of the first and second MOS transistors conductive and not to make the channels of these first and second MOS transistors conductive respectively;

wherein each of the first and second MOS transistors have source-drain diodes in anti-series so that said first and second MOS transistors have a respective maximum breakdown voltage at drain voltages in mutually opposite directions relative to a substrate voltage, wherein the control circuit comprises: a power supply input for supplying a power supply voltage with a first polarity relative to the power supply reference conductor the first conductivity type being such that the channel of the first MOS transistor becomes conductive when a voltage at its gate has a second polarity, opposite the first polarity relative to its source; a pump circuit fed with the power supply voltage and arranged to generate the gate voltage of the first MOS transistor with the second polarity relative to the power supply reference conductor in the "on" state.

2. An electronic circuit according to claim 1, comprising a further power supply reference conductor and a further switching circuit, complementary to the switching circuit, the further switching circuit comprising: a third MOS transistor of the second conductivity type, having a source, a drain and a gate, the source being coupled to the further power supply reference conductor a second MOS transistor of the first conductivity type, with a source, a drain and a gate, the source being coupled to the drain of the third MOS transistor the drain being coupled to the signal conductor or a further signal conductor; the control circuit having outputs coupled to the gate of the third MOS transistor and the gate and source of the fourth MOS transistor the control circuit applying gate source voltages to the third and fourth MOS transistor to make these third and fourth MOS transistors conductive and not to make these transistors conductive respectively.

3. An electronic circuit according to claim 2, wherein the control circuit is arranged to supply first substantially matching gate-source voltages to the first and fourth MOS transistor and second substantially matching gate-source voltages to the second and third MOS transistor.

4. An electronic circuit, comprising a signal conductor a power supply reference conductor and a switching circuit coupled between the signal conductor and the power supply reference conductor, the switching circuit comprising: a substrate arrangement coupled to the power supply reference conductor; a first MOS transistor realized on said substrate arrangement with a source, a drain and a gate, the source being coupled to the power supply reference conductor the first MOS transistor having a first conductivity type; a second MOS transistor realized on said substrate arrangement with a source, a drain and a gate, the source being coupled to the drain of the first MOS transistor the drain being coupled to the signal conductor the second MOS transistor having a second conductivity type opposite the first conductivity type: a control circuit with outputs coupled to the gate of the first MOS transistor and the gate source of the second MOS transistor the control circuit being arranged to switch between an "on" state and an "off" state, in which the control circuit controls the gate source voltages of the first and second MOS transistors to make channels of the first and second MOS transistors conductive and not to make the channels of the first and second MOS transistors conductive respectively;

wherein each of the first and second MOS transistors have source-drain diodes in anti-series so that said first and second MOS transistors have a respective maximum breakdown voltage at drain voltages in mutually opposite directions relative to a substrate voltage, wherein the control circuit comprises: a power supply input for supplying a power supply voltage relative to the power supply reference conductor with a first polarity, the second conductivity type being such that the channel of the second MOS transistor becomes conductive when a voltage at its gate has a second polarity, opposite the first polarity relative to its source; a resistive element coupled between the gate and source of the second MOS transistor; a current source circuit coupled between the power supply input and the gate of the second MOS transistor for supplying a predetermined, state dependent current from the power supply input to through the resistive element.

5. An electronic circuit, comprising a signal conductor a power supply reference conductor and a switching circuit coupled between the signal conductor and the power supply reference conductor, the switching circuit comprising:

a substrate arrangement coupled to the power supply reference conductor; a first MOS transistor realized on said substrate arrangement with a source, a drain and a gate, the source being coupled to the power supply reference conductor the first MOS transistor having a first conductivity type; a second MOS transistor realized on said substrate arrangement with a source, a drain and a gate, the source being coupled to the drain of the first MOS transistor the drain being coupled to the signal conductor the second MOS transistor having a second conductivity type opposite the first conductivity type; a control circuit with outputs coupled to the gate of the first MOS transistor and the gate and source of the second MOS transistor the control circuit being arranged to switch between an "on" state and an "off" state, in which the control circuit controls the gate source voltages of the first and second MOS transistor to make channels of these MOS transistors conductive and not to make the channels of these first and second transistors conductive respectively wherein the control circuit comprises: a power supply input for supplying a power supply voltage relative to the power supply reference conductor with a first polarity, the second conductivity type being such that the channel of the second MOS transistor becomes conductive when a voltage at its gate has a second polarity, opposite the first polarity relative to its source; a resistive element coupled between the gate and source of the second MOS transistor; a current source circuit coupled between the power supply input and the gate of the second MOS transistor for supplying a predetermined, state dependent current from the power supply input to through the resistive element, and further comprising a further resistive element and a current mirror circuit with an input branch and an output branch, the further resistive element and the input branch being coupled in series between the power supply reference conductor and the further power supply reference conductor the output branch being coupled to the gate of the second MOS transistor an input/output factor of the current mirror and a ratio between resistance values of the resistive element and the further resistive element having values so that a first voltage drop over the further resistive element is substantially equal to a second voltage drop over the resistive element.

6. An electronic circuit according to claim 5, wherein the control circuit comprises: a pump circuit fed with the power supply voltage and arranged to generate the gate voltage of the first MOS transistor with the first polarity relative to the power supply reference conductor in the "on" state, the pump circuit comprising junction type pumping diodes, the current mirror comprising bipolar transistors.

* * * * *